(12) United States Patent
Cho

(10) Patent No.: US 7,037,822 B2
(45) Date of Patent: May 2, 2006

(54) METHOD OF FORMING METAL LINE IN SEMICONDUCTOR DEVICE

(75) Inventor: Ihl Hyun Cho, Daejeon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 295 days.

(21) Appl. No.: 10/731,480

(22) Filed: Dec. 10, 2003

(65) Prior Publication Data
US 2005/0014384 A1   Jan. 20, 2005

(30) Foreign Application Priority Data
Jul. 18, 2003   (KR) .................. 10-2003-0049469

(51) Int. Cl.
*H01L 21/4763* (2006.01)

(52) U.S. Cl. .................. 438/624; 438/633; 438/634; 438/637

(58) Field of Classification Search .................. None
See application file for complete search history.

(56) References Cited

U.S. PATENT DOCUMENTS

| 6,071,814 | A | 6/2000 | Jang |
| 6,319,809 | B1 | 11/2001 | Chang et al. |
| 6,323,121 | B1 | 11/2001 | Liu et al. |
| 6,417,096 | B1 | 7/2002 | Chen et al. |
| 6,924,234 | B1 * | 8/2005 | Han et al. .................. 438/687 |
| 2004/0087164 | A1 * | 5/2004 | Bao et al. .................. 438/694 |
| 2004/0100779 | A1 * | 5/2004 | Kraft ........................ 361/760 |
| 2004/0110369 | A1 * | 6/2004 | Jiang et al. ............... 438/637 |

* cited by examiner

*Primary Examiner*—Duy-Vu N. Deo
(74) *Attorney, Agent, or Firm*—Mayer, Brown, Rowe & Maw LLP

(57) ABSTRACT

Disclosed in a method of forming a metal line in a semiconductor device. The method includes the steps of sequentially forming a first etch stop film, a second interlayer insulating film and a BARC film on a first interlayer insulating film into which a metal line is buried, forming a photoresist pattern defining a trench in a given region of the BARC film, performing an etch process up to the second interlayer insulating film using the photoresist pattern as an etch mask to form a trench, removing the photoresist pattern and the BARC film by means of a first wet etch process, etching the first etch stop film by means of a second wet etch process using the second interlayer insulating film an as etch mask, and cleaning the resulting entire surface by means of a third wet etch process. As such, by removing the photoresist pattern, the BARC film and the etch stop film through the wet etch process, it is possible to reduce the amount of polymer generated in the process for forming the via hole and the metal line trench.

5 Claims, 3 Drawing Sheets

METHOD OF FORMING METAL LINE IN SEMICONDUCTOR DEVICE

BACKGROUND

1. Field of the Invention

The present invention relates to a method of forming a metal line in a semiconductor device and, more particularly, to a method of forming a metal line through a damascene process in the formation of a semiconductor device.

2. Discussion of Related Art

Nowadays, as the integration level in a semiconductor device is gradually higher integrated and densified, copper having a low resistance is used in a metal line that is formed through a damascene process.

A damascene process for forming a metal line according to a prior art will be described. A bottom anti-reflective coating (BARC) film is formed in a structure wherein an etch stop film and an interlayer insulating film are stacked, more than one time, on an interlayer insulating film into which a copper wiring metal is buried. A photoresist pattern, a pattern of a metal line trench, is formed in a given region of the BARC film. An etch process using the photoresist pattern as an etch mask is then performed to form a metal line trench.

Meanwhile, after forming the metal line trench, the photoresist pattern and the BARC film are removed. In this case, this is performed by a dry etch.

In case where the photoresist pattern and the BARC film are removed by the dry etch, however, there occurs a problem that the amount of polymer generated upon etching is increased.

SUMMARY OF THE INVENTION

The present invention is directed to provide a method of forming a metal line in a semiconductor device capable of reducing the amount of polymer generating upon a process for forming a metal line trench.

One aspect of the present invention is to provide a method of forming a metal line in a semiconductor device, including the steps of sequentially forming a first etch stop film, a second interlayer insulating film, a second etch stop film and a third interlayer insulating film on a first interlayer insulating film into which a metal line is buried, forming a first photoresist pattern defining a via hole in a given region of the third interlayer insulating film, performing an etch process up to the first etch stop film using the first photoresist pattern as an etch mask to form the via hole, and then removing the first photoresist pattern, forming a BARC film on the resulting surface and then forming a second photoresist pattern defining the metal line in another given region of the BARC film, performing an etch process using the second photoresist pattern as an etch mask up to the second etch stop film to form a metal line trench, and then removing the second photoresist pattern and the BARC film by means of a first wet etch process, etching the first etch stop film by means of a second wet etch process using the second interlayer insulating film as an etch mask, and cleaning the resulting entire surface by means of a third wet etch process.

In the aforementioned of a method of forming a metal line in a semiconductor device according to another embodiment of the present invention, the first wet etch process is performed using an aqueous solution in which sulfuric acid ($H_2SO_4$) and hydrogen peroxide ($H_2O_2$) are mixed in the ratio of one of 2:1, 4:1 and 6:1 at a bath temperature of about 100 to 140° C. for about 2 to 10 minutes.

In the aforementioned of a method of forming a metal line in a semiconductor device according to another embodiment of the present invention, $HNO_3$ of 60 to 90% is mixed at a bath temperature of about 140 to 180° C. for about 10 to 60 minutes.

In the aforementioned of a method of forming a metal line in a semiconductor device according to another embodiment of the present invention, the third wet etch process is performed using an aqueous solution in which HF and DI water are mixed in the ratio of one of 200:1, 19:1, 500:1 and 600:1 at a bath temperature of a room temperature for about 10 to 60 minutes.

Another aspect of the present invention is to provide a method of forming a metal line in a semiconductor device, including the steps of sequentially forming a first etch stop film, a second interlayer insulating film and a BARC film on a first interlayer insulating film into which a metal line is buried, forming a photoresist pattern defining a trench in a given region of the BARC film, performing an etch process up to the second interlayer insulating film using the photoresist pattern as an etch mask to form a trench, removing the photoresist pattern and the BARC film by means of a first wet etch process, etching the first etch stop film by means of a second wet etch process using the second interlayer insulating film an as etch mask, and cleaning the resulting entire surface by means of a third wet etch process.

DETAILED DESCRIPTION OF PREFERRED EMBODIMENTS

Figure 1:
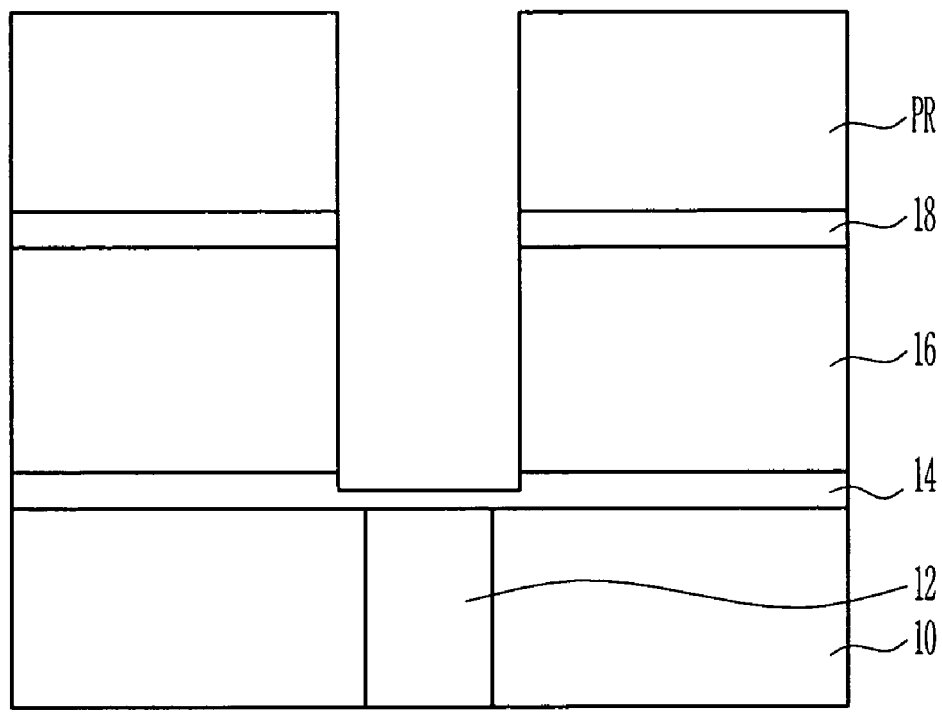
FIGS. 1 to 3 are cross-sectional views for explaining a method of forming a metal line in a semiconductor device according to a first embodiment of the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in the drawing, the thickness and size of each layer are exaggerated for convenience of explanation and clarity. Like reference numerals are used to identify the same or similar parts. Further, in case where it is described that one film is "on" the other film or a semiconductor substrate, the one film may directly contact the other film or the semiconductor substrate. A third film may be intervened between the one film and the other film or the semiconductor substrate.

Figure 2:
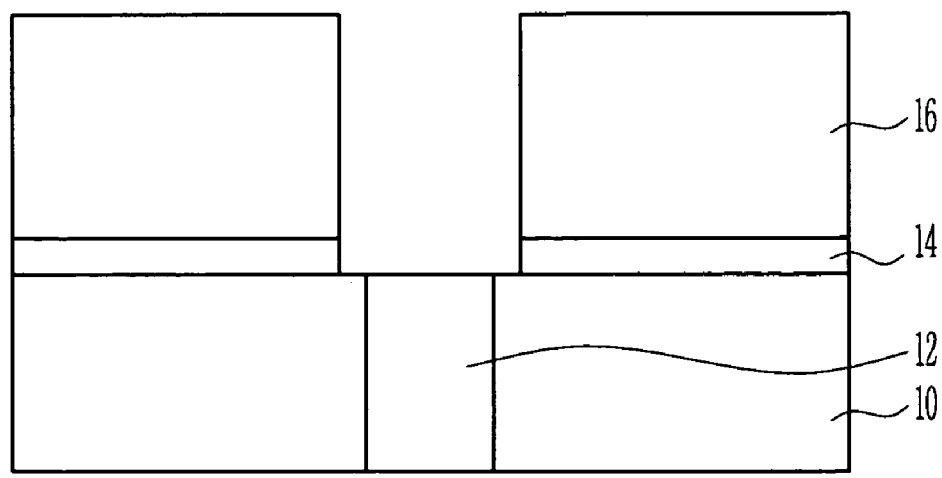
Figure 3:
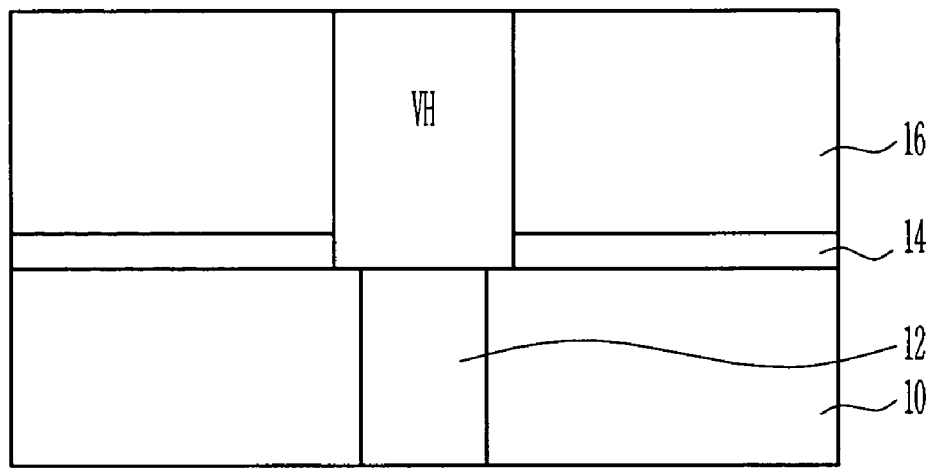

FIGS. 1 to 3 are cross-sectional views for explaining a method of forming a metal line in a semiconductor device according to a first embodiment of the present invention.

Referring to FIG. 1, a first etch stop film 14, a second interlayer insulating film 16 and a first BARC film 18 are sequentially on a first interlayer insulating film 10 into which a copper metal line 12 is buried. A photoresist pattern (PR) is formed in a given region of the BARC film 18. An etch process using the PR as an etch mask is performed up to the BARC film 18 and the second interlayer insulating film 16, thus forming a via hole (VH).

With reference to FIG. 2, a first wet etch process is performed in order to remove the first photoresist pattern PR1 and the first BARC film 18 remained after the formation of the via hole (VH) and residues generated in the process of forming the via hole. The first wet etch process is performed using an aqueous solution in which sulfuric acid ($H_2SO_4$) and hydrogen peroxide ($H_2O_2$) are mixed in a given ratio. In the above, it is preferred that sulfuric acid: hydrogen peroxide is mixed in the ratio of 2:1, 4:1 or 6:1. Furthermore, it is preferable that the first wet etch process is performed at a bath temperature of about 100 to 140° C. for about 2 to 10 minutes. A second wet etch process is performed, using the patterned second interlayer insulating film 16 as an etch mask, to etch the first etch stop film 14. The second wet etch process is performed using an aqueous solution in which $HNO_3$ of 60 to 90% is mixed. Also, the second wet etch process is preferably performed at a bath temperature of about 140 to 180° C. for about 10 to 60 minutes. In order to prevent the bottom of the first etch stop film, i.e., the top surface of the copper metal line 12 from being oxidized during the etch process, a third wet etch process is performed for the above results. The third wet etch process is performed using a wet etchant wherein HF and de-ionized (DI) water are mixed in a given ratio. In this case, it is preferred that HF and DI water are mixed in the ratio of 200:1, 19:1, 500:1 or 600:1. Furthermore, it is preferable that the third wet etch process at a bath temperature of a room temperature for about 10 to 60 minutes.

By reference to FIG. 3, a copper seed layer is formed in the via hole (VH) for which the third wet etch process is completed. A via hole (V) into which a copper metal is buried through an electroplating method is formed, thereby completing the process.

Figure 4:
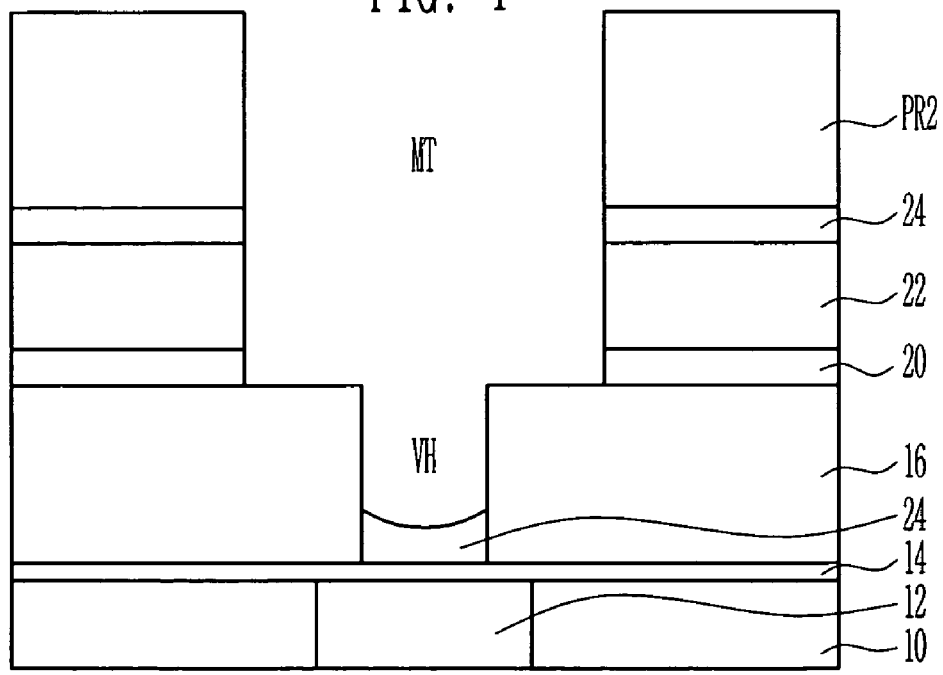
FIGS. 4 to 6 are cross-sectional views for explaining a method of forming a metal line in a semiconductor device according to a second embodiment of the present invention.
Figure 5:
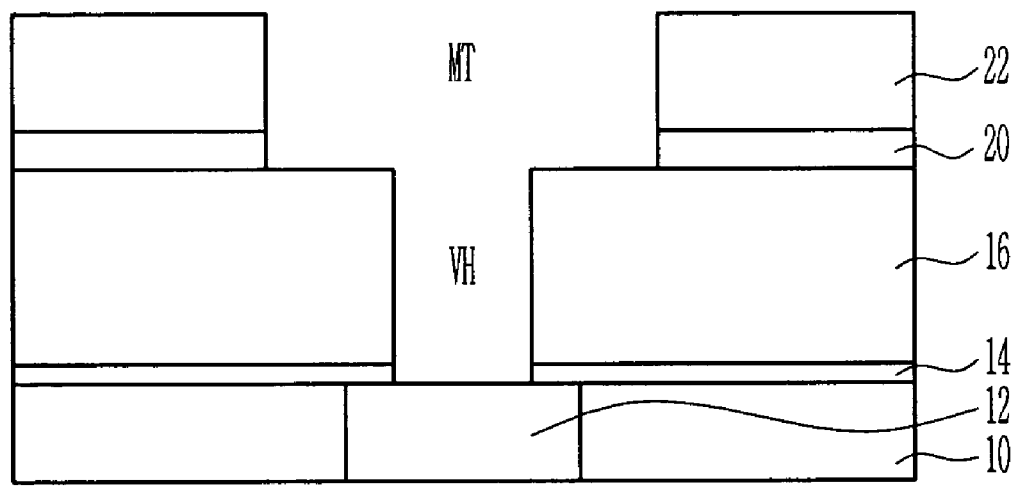
Figure 6:
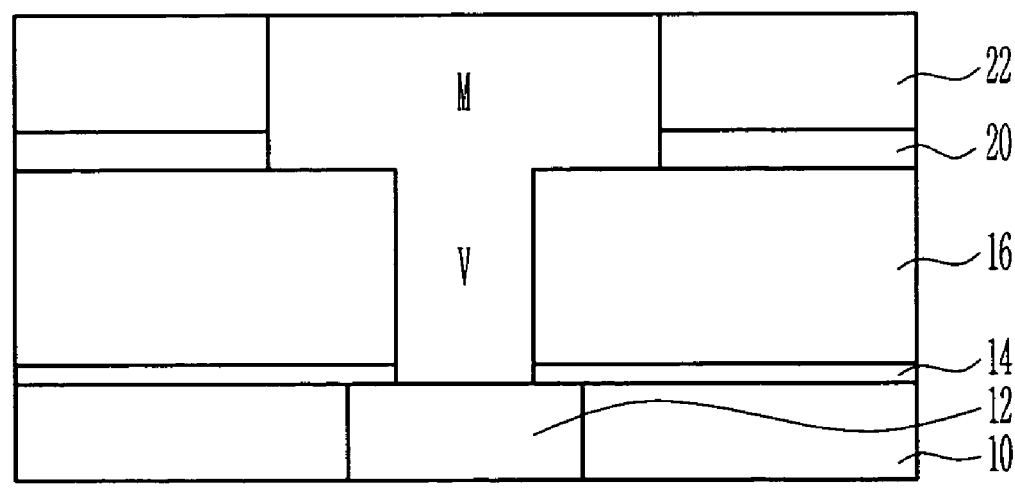

FIGS. 4 to 6 are cross-sectional views for explaining a method of forming a metal line in a semiconductor device according to a second embodiment of the present invention.

Referring to FIG. 4, a first etch stop film 14, a second interlayer insulating film 16, a second etch stop film 20 and a third interlayer insulating film 22 are sequentially formed on the first interlayer insulating film 10 into which the copper metal line 12 is buried. After a second photoresist pattern (not shown) is formed in a given region of the third interlayer insulating film 22, an etch process using the second photoresist pattern as an etch mask is performed up to the first etch stop film 14, thus forming a via hole (VH). After the second photoresist pattern (not shown) is removed, a second BARC film 24 is formed on the resulting surface. After a third photoresist pattern (PR2) is formed in a given region of the second BARC film 24, an etch process using the third photoresist pattern (PR2) as an etch mask is performed up to the second etch stop film 20, thereby forming a metal line trench (MT). In this case, the second BARC film 24 remains only at the bottom of the via hole.

Referring to FIG. 5, a first wet etch process is performed in order to remove the third photoresist pattern PR2 and the second BARC film 24 remained after the formation of the via hole (VH) and the metal line trench (MT) and to remove residues generated in the process of forming the via hole (VH) and the metal line trench (MT). The first wet etch process is performed using an aqueous solution in which sulfuric acid ($H_2SO_4$) and hydrogen peroxide ($H_2O_2$) are mixed in a given ratio. In the above, it is preferred that sulfuric acid: hydrogen peroxide are mixed in the ratio of 2:1 or 4:1 or 6:1. Furthermore, it is preferable that the first wet etch process is performed at a bath temperature of about 100 to 140° C. for about 2 to 10 minutes. A second wet etch process is performed, using the patterned third interlayer insulating film 22 as an etch mask, to etch the first etch stop film 14. The second wet etch process is performed using an aqueous solution in which $HNO_3$ of 60 to 90% is mixed. Also, the second wet etch process is preferably performed at a bath temperature of about 140 to 180° C. for about 10 to 60 minutes. In order to prevent the bottom of the first etch stop film 14, i.e., the top surface of the copper metal line 12 from being oxidized during the etch process, a third wet etch process is performed for the above results. The third wet etch process is performed using a wet etchant wherein HF and de-ionized (DI) water are mixed in a given ratio. In this case, it is preferred that HF and DI water are mixed in the ratio of 200:1 or 19:1 or 500:1 or 600:1. Furthermore, it is preferable that the third wet etch process at a bath temperature of a room temperature for about 10 to 60 minutes.

By reference to FIG. 6, a copper seed layer is formed in the via hole (VH) and the metal line trench (MT) for which the third wet etch process is completed. A via hole (V) and a metal line (M) into which a copper metal is buried through an electroplating method are formed, thereby completing the process.

As described above, the present invention has an advantage that it can reduce the amount of polymer generating in the above process by removing the photoresist pattern, the BARC film and the etch stop film through the wet etch process.

Furthermore, it is possible to reduce the amount of polymer generating in a process for forming a via hole and a metal line trench by reducing a photoresist pattern, a BARC film and an etch stop film through a wet etch process.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a metal line in a semiconductor device, comprising the steps of:
   sequentially forming a first etch stop film, a second interlayer insulating film, a second etch stop film and a third interlayer insulating film on a first interlayer insulating film into which a metal line is buried;
   forming a first photoresist pattern defining a via hole in a given region of the third interlayer insulating film;
   performing an etch process using the first photoresist pattern as an etch mask up to the first etch stop film to form the via hole, and then removing the first photoresist pattern;
   forming a BARC film on the resulting surface and then forming a second photoresist pattern defining the metal line in another given region of the BARC film;
   performing an etch process using the second photoresist pattern as an etch mask up to the second etch stop film to form a metal line trench, and then removing the second photoresist pattern and the BARC film by means of a first wet etch process;
   etching the first etch stop film by means of a second wet etch process using the second interlayer insulating film as an etch mask; and
   cleaning the resulting entire surface by means of a third wet etch process.

2. The method as claimed in claim 1, wherein the first wet etch process is performed using an aqueous solution in which sulfuric acid ($H_2SO_4$) and hydrogen peroxide ($H_2O_2$) are mixed in the ratio of one of 2:1, 4:1 and 6:1 at a bath temperature of about 100° C. to 140° C. for about 2 to 10 minutes.

3. The method as claimed in claim 1, wherein the second wet etch process is performed using an aqueous solution in which $HNO_3$ of 60 to 90% is mixed at a bath temperature of about 140° C. to 180° C. for about 10 to 60 minutes.

4. The method as claimed in claim 1, wherein the third wet etch process is performed using an aqueous solution in which HF and DI water are mixed in the ratio of one of 200:1, 19:1, 500:1 and 600:1 at a bath temperature of a room temperature for about 10 to 60 minutes.

5. A method of forming a metal line in a semiconductor device, comprising the steps of:

sequentially forming a first etch stop film, a second interlayer insulating film and a BARC film on a first interlayer insulating film into which a metal line is buried;

forming a photoresist pattern defining a trench in a given region of the BARC film;

performing an etch process up to the second interlayer insulating film using the photoresist pattern as an etch mask to form a trench;

removing the photoresist pattern and the BARC film by means of a first wet etch process;

etching the first etch stop film by means of a second wet etch process using the second interlayer insulating film an as etch mask; and cleaning the resulting entire surface by means of a third wet etch process.

* * * * *